United States Patent [19]

Kitazawa

[11] Patent Number: 6,147,912
[45] Date of Patent: *Nov. 14, 2000

[54] NON-VOLATILE SEMICONDUCTOR MEMORY AND METHOD FOR READING DATA STORED THEREIN

[75] Inventor: Shooji Kitazawa, Tokyo, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/227,211

[22] Filed: Jan. 8, 1999

[30] Foreign Application Priority Data

Jan. 12, 1998 [JP] Japan ................................. 10-004057

[51] Int. Cl.[7] ...................................................... G11C 7/00
[52] U.S. Cl. .............................. 365/189.02; 365/189.01; 365/205; 365/226; 365/189.09
[58] Field of Search ........................ 365/185.01, 189.01, 365/189.02, 230.01, 205, 226, 189.09

[56] References Cited

U.S. PATENT DOCUMENTS 5,450,354  9/1995  Sawada et al. ......................... 365/207
5,517,448  5/1996  Liu ...................................... 365/185.11
5,748,538  5/1998  Lee et al. ............................ 365/185.06
5,886,937  3/1999  Jang ........................................ 365/203

FOREIGN PATENT DOCUMENTS 2-210694  8/1990  Japan .

*Primary Examiner*—Viet Q. Nguyen
*Attorney, Agent, or Firm*—Jones Volentine, LLC

[57] ABSTRACT

A non-volatile semiconductor memory apparatus having a memory matrix of inter-column arrangement type configuration divided into several segments performs a read operation based on a system that causes a current to flow into sense amplifiers from data lines. In this non-volatile semiconductor memory, memory cell transistors configured as memory cells are serially connected to form multiple memory rows. Word lines connect the gates of the transistors constituting the memory cells of each memory row. First column lines and second column lines connect the connection nodes between the memory cell transistors. The word lines and the first and second column lines constitute a memory array. Bit lines are connected to the second column lines, respectively. A bias electric potential supply line is connected to the first column lines via select transistors, respectively. A multiplexer circuit includes select transistors which select two bit lines as a pair from the bit lines, and connect the selected two bit lines to a data bus pair. Sense amplifiers are connected to the data buses, respectively.

22 Claims, 2 Drawing Sheets

NON-VOLATILE SEMICONDUCTOR MEMORY AND METHOD FOR READING DATA STORED THEREIN

BACKGROUND OF THE INVENTION

1. Field of the Invention

The present invention relates to a non-volatile semiconductor memory including a mask ROM, an OTP, an EPROM, an EEPROM, and a FLASH memory which simultaneously achieves high speed information reading and a high degree of integration and a method for reading data from the non-volatile semiconductor memory.

2. Description of the Background Art

Non-volatile semiconductor memories realize most highly integrated memory LSIs by using a single transistor as a memory cell (herein after a memory cell transistor). As a standard method for storing information, the threshold voltage of the memory cell transistor is changed in accordance with the information. In the case of the EPROM and FLASH memory, the threshold voltage of the memory cell transistor is changed by changing the amount of electrons charged in the floating gate. In the case of the mask ROM, the threshold value of the memory cell transistor is changed by adjusting the concentration of impurities such as phosphorus or boron introduced in a channel region.

Corresponding to desired functions and performances of each type of memory LSI to be realized, many types of systems coexist for a memory cell matrix configuration for arranging multiple memory cell transistors in the row and column directions, a matrix driving circuit for selecting a memory cell transistor corresponding to a read address within the memory cell matrix, and an information detecting circuit for judging whether the selected transistor is conductive or not and outputting the information. In what follows, prior arts related to each of these three items will be explained.

According to the conventional memory cell matrix configuration, sources and drains of multiple memory cells are connected to each pair of adjacent column lines to form a column arrangement, and multiple row lines are connected commonly to the gates of the memory cells of each of the column of the column arrangement. This configuration can achieve the highest degree of integration and does not have any diffusion layer, which is a high resistance material, on the current path for reading information stored in the memory cell. Therefore, this configuration is suitable for high speed non-volatile semiconductor memories having a high degree of integration.

However, if this configuration is used to form a memory cell matrix having a large area, the resistance of the metal line material that constitutes the column line cannot be ignored. To cope with this problem, each of the column lines is divided to form sub-bit lines. A selection transistor constituted of a transistor that differs from the memory cell is then provided for each divided unit. This selection transistor is connected to a low resistance main bit line made of another metal line. This method is disclosed in the Japanese Patent Application Laid-Open No. 2565109. The memory cell matrix configuration disclosed in this Japanese Patent Application Laid-Open will be hereafter called an inter-column arrangement type memory cell matrix configuration.

Next, the conventional matrix driving circuit for the inter-column arrangement type memory cell matrix configuration will be explained. As described in the Japanese Patent Application Laid-Open No. 2565104, according to the inter-column arrangement type memory cell matrix configuration, non-selection memory cells on a selected row line can be conductive. Therefore, all the memory cells on the selected row line can be conductive under the worst condition.

According to the read operation of the inter-column arrangement type memory cell matrix disclosed in the Japanese Patent Application Laid-Open No. 2565104, 2-bit information is read simultaneously from the memory cell. A ground potential GND is applied to the column line connected to the memory cell that is simultaneously read. Thus, a read current flows corresponding to the data read from the memory cell. A data read circuit then identifies and outputs the read current. On the other hand, the electric potential difference between those columns connected to unread memory cells is set to a very small value, causing little amount of current to flow. As a result, little amount of leak current flows from the column lines connected to the unread memory cells. Thus, the data read speed is prevented from being reduced.

Lastly, the conventional information detection circuit will be explained. Installed in the non-volatile semiconductor memory disclosed in the Japanese Patent Application Laid-Open No. H3-13675 is a circuit which applies a relatively high electric potential, for example, 1V to the memory cell matrix, and detects the inflow current while applying a relatively low electric potential, for example, 0.2V to the selected column line. According to this configuration, it is possible to set to 1V the electric potentials of the source and drain of the non-selection memory cells connected to the row lines. As a result, the load capacitance of the channel unit of the non-selection memory cell as floating capacitance is reduced, and the speed of signal transmission through the row lines can be increased.

However, as an inflow current detection system, only the one applicable to semiconductor integrated circuits having a memory cell matrix of simple NOR configuration constituted of high electric potential lines provided parallel to the row lines and bit lines provided orthogonal to the high electric potential lines was disclosed.

According to the inter-column arrangement type memory matrix configuration, a select transistor that does not share its source or drain with the other select transistors needs to be installed on both sides of each sub-bit line to connect the main bit line with the sub-bit line. Since the memory cell must be formed using transistor columns of the smallest size, the above-mentioned select transistor must be installed on both sides of each array segment providing the same pitch as the transistor columns. However, the select transistor needs to have a large gate width since the select transistor needs a capability to drive a sufficiently large amount of current in comparison with the memory cell.

Moreover, according to the matrix driving circuit of the inter-column arrangement type memory matrix configuration described in the Japanese Patent Application Laid-Open No. 2565104, the circuit for selecting a column line and a column decoder is complicated. Therefore, it is impossible to separate the main bit lines from the sub-bit lines to create a gap having a small area and provide a select transistor for controlling the gap.

Moreover, when an inflow current detection system is applied to the memory matrix having an inter-column arrangement type configuration, the leak between two selected adjacent column lines, which is a problem pointed out in the Japanese Patent Application Laid-Open No. 2565104, turns even more serious since the electric potentials of the drain and source of the non-selection memory cells that cause the leak are low. Therefore, a high impedance cannot be obtained by an inter-column resistance formed by a single memory cell, making it difficult to obtain a sufficiently wide operation margin.

SUMMARY OF THE INVENTION

It is an object of the present invention to provide a non-volatile semiconductor integrated circuit, which has a selection function with a low connection resistance, capable of connecting main bit lines to sub-bit lines in a memory matrix having an inter-column arrangement type configuration.

It is another object of the present invention to provide a non-volatile semiconductor integrated circuit having a circuit for driving the memory matrix having an inter-column arrangement type configuration using an inflow detection system.

A non-volatile semiconductor memory of the present invention includes a memory cell array having memory rows each of which has serially connected memory cell transistors. The non-volatile memory further includes word lines commonly connecting gates of the memory cell transistors, column lines connected to the memory cells in a direction substantially perpendicular to the memory rows. The column lines include first column lines and second column lines located between the first column lines. The non-volatile memory further includes select transistors, a bias potential supply line connected to the first column lines through the select transistors, a data bus, a multiplexer circuit connected to the second column lines and the data bus and a sense amplifier connected to said data bus. The multiplexer circuit selectively connects one of the second column lines with the data bus.

DETAILED DESCRIPTION OF THE PREFERRED EMBODIMENTS

Figure 1:
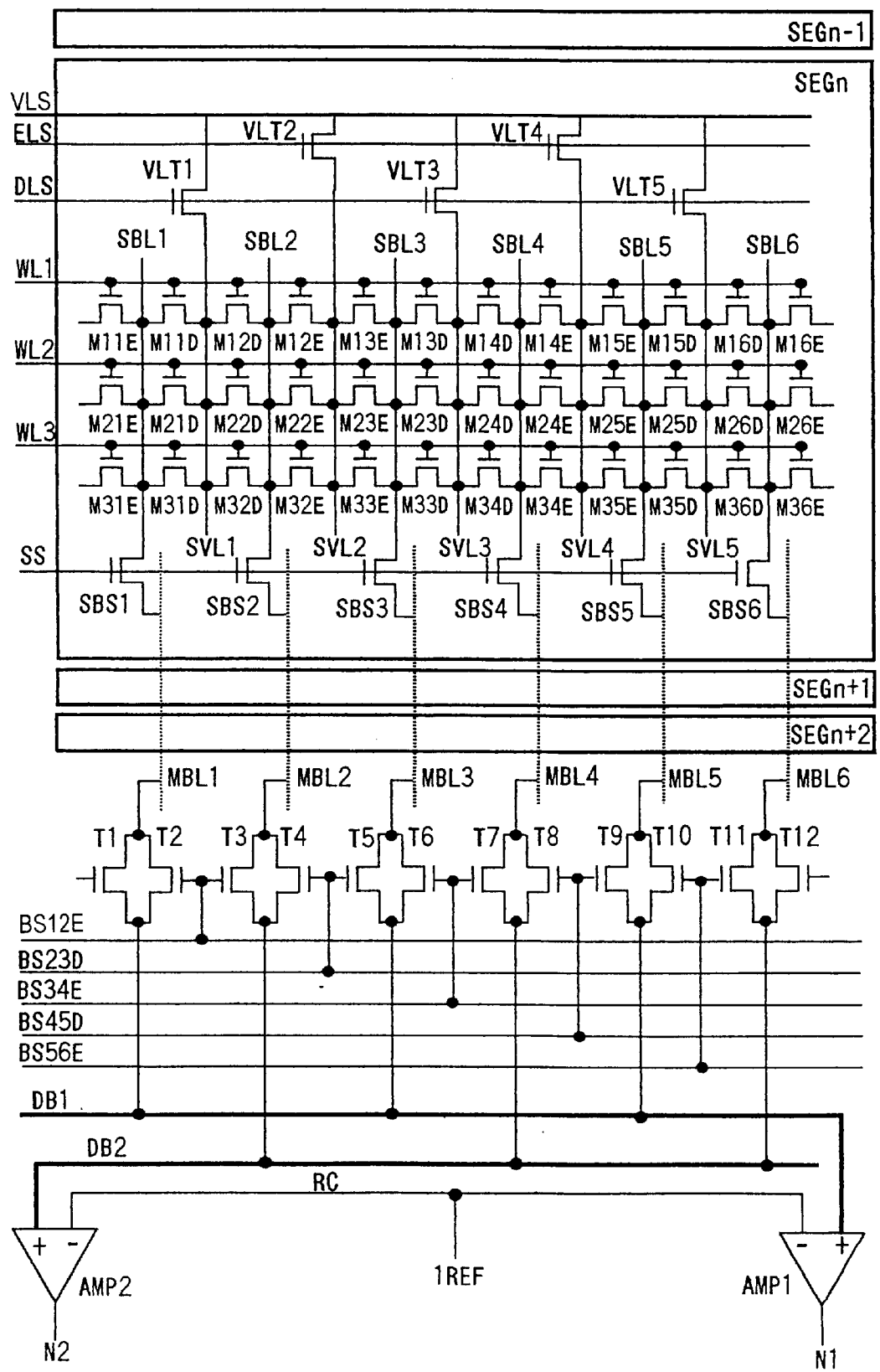
FIG. 1 shows a portion of the circuit according to the first embodiment of the present invention.

FIG. 1 is a schematic circuit diagram showing the first embodiment of the present invention. Memory cell transistors M11E through M36E are selected in accordance with written data and turn conductive or non-conductive. In each of segments SEGn−1, . . . SEGn+2, the gate electrodes of the memory cell transistors M11E through M16E are connected commonly to a word line WL1. Similarly, the gate electrodes of the memory cell transistors M21E through M26E are connected commonly to a word line WL2. The gate electrodes of the memory cell transistors M31E through M36E are connected commonly to a word line WL3. Each of the groups of memory cell transistors whose gate electrodes are commonly connected forms a row. Adjacent rows of memory cell transistor groups are connected via a diffusion region. The drains and sources of these memory cell transistors are commonly connected by the diffusion region. The number of rows within each segment is set to, for example, about 128. However, in this embodiment, the number of rows within each segment is set to three for ease of explanation.

The diffusion region of each row is alternately connected to sub-bit lines SBL1, SBL2, . . . SBL6 and to sub-bias lines SVL1, SVL2, . . . SVL5, which are formed for each row and formed of metal of the first metal layer. The sub-bit lines SBL1, SBL2, . . . SBL6 are connected to main bit lines MBL1, MBL2, . . . MBL6, which are formed of metal of the second metal layer, via select transistors SBS1, SBS2, . . . SBS6, respectively. Here, the main bit lines MBL1, MBL2, . . . MBL6 are given a sufficiently wide pitch compared with the sub-bit lines SBL1, SBL2, . . . SBL6 and sub-bias lines SVL1, SVL2, . . . SVL5. Therefore, the main bit lines MBL1, MBL2, . . . MBL6 are formed using a wider aluminum line or the like. Therefore, the resistance of the main bit lines MBL1, MBL2, . . . MBL6 are very low. Since the select transistors SBS1, SBS2, . . . SBS6 are given a sufficiently wide pitch compared with the memory cell transistors M11E through M36E, the select transistors SBS1, SBS2, . . . SBS6 are provided using low resistance transistors having a large area. The gates of all the select transistors within the same segment are commonly connected to a segment selection signal line SS and are controlled by a segment selection signal.

The sub-bias lines SVL1, SVL2, . . . SVL5 are connected to a bias line VLS, which are formed of metal of the first metal layer, via bias transistors VLT1, VLT2, . . . VLT5, respectively. A first bias cut signal DLS is supplied commonly to the odd numbered bias transistors VLT1, VLT3, and VLT5. A second bias cut signal ELS is supplied commonly to the even numbered bias transistors VLT2 and VLT4.

The odd numbered main bit lines MBL1, MBL3, and MBL5 are selectively connected to a first data bus DB1 via multiplexer transistor pairs T1 and T2, T5 and T6, and T9 and T10, respectively. The even numbered main bit lines MBL2, MBL4, and MBL6 are selectively connected to a second data bus DB2 via multiplexer transistor pairs T3 and T4, T7 and T8, and T11 and T12, respectively. The gate electrodes of the adjacent multiplexer transistors T2 and T3, T4 and T5 . . . are connected commonly to bit line selection signal lines BS12E, BS23D, BS34E, BS45D, and BS56E, respectively.

A pair of sense amplifiers AMP1 and AMP2 compare a magnitude of the inflow current on a selected bit line as data with the magnitude of the reference current Iref and outputs the result of the comparison as detection signals N1 and N2. For the sense amplifiers, for example, the circuit disclosed in the Japanese Patent Application Laid-Open No. 64-37798 can be used. The first sense amplifier AMP1 compares the magnitude of the inflow current supplied from the first data bus DB1 with the magnitude of the reference current Iref and outputs an output signal N1 in accordance with the result of the comparison. The second sense amplifier AMP2 compares the magnitude of the inflow current supplied from the second data bus DB2 with the magnitude of the reference current Iref and outputs an output signal N2 in accordance with the result of the comparison. The reference current Iref is shared by the pair of sense amplifiers AMP1 and AMP2 via a signal line RC.

Next, the operation of the circuit of the first embodiment will be explained. Here, as an exemplary memory read operation, the case in which the memory cell transistors M23E and M24E are paired will be explained. In this case, the memory cell transistors M23E and M24E are connected to the first and second sense amplifiers AMP1 and AMP2, respectively. The circuit determines whether each memory cell is conductive or not and outputs output signals N1 and N2 whose voltage levels correspond to the result of the determination. This operation will be explained in detail.

Since A voltage of 1.5V is applied to the bias line VLS regardless of the segment to be read. Since the voltage level of the second bias cut signal ELS is a high voltage level Vcc, the bias transistors VLT2 and VLT4 are conductive. Since the voltage level of the first bias cut signal DLS is 0V (i.e., the ground level Vss), the bias transistors VLT1, VLT3, and VLT5 are non-conductive. The ground level Vss is applied to the word lines WL1 and WL3 so that all the memory cells on the rows are non-conductive. On the other hand, the high voltage level Vcc is applied to the word line WL2. The voltage level of the segment selection signal SS is the high voltage level Vcc so that all the select transistors SBS1, SBS2, . . . SBS6 within the segment SEGn are conductive.

All the other select transistors in the other segments SEGn−1, SEGn+1, SEGn+2, . . . are made non-conductive by other segment selection signals not shown in the drawing. The ground level Vss is applied to the bit line selection signal lines BS12E, BS23D, BS45D, BS56E so that the multiplexer transistors T1 through T5 and T8 through T12 are non-conductive. On the other hand, the high voltage level Vcc is applied to the bit line selection signal line BS34E so that the multiplexer transistors T6 and T7 are conductive. Therefore, the main bit lines MBL3 and MBL4 are connected to the first and second data buses DB1 and DB2, respectively.

The sense amplifiers AMP1 and AMP2 independently apply 0.2V to the data buses DB1 and DB2, respectively, and determine the inflow current amount. By the above-described setting, the memory cell transistor M23E is positioned on a current flow path that passes through the bias line VLS, bias transistor VLT2, sub-bias line SVL2, memory cell transistor M23E, sub-bit line SBL3, select transistor SBS3, multiplexer transistor T6, data bus DB1, and sense amplifier AMP1. Similarly, the memory cell transistor M24E is positioned on a current flow path that passes through the bias line VLS, bias transistor VLT4, sub-bias line SVL4, memory cell transistor M24E, sub-bit line SBL4, select transistor SBS4, multiplexer transistor T7, data bus DB2, and sense amplifier AMP2. On these paths, the portion between the bias line VLS and memory cell transistor M23E or M24E constitutes a path between the power- source and memory cells. Therefore, even if multiple floating lines need to be charged or discharged, the portion between the bias line VLS and memory cell transistor M23E or M24E does not have a serious adverse influence on the conductive state detection speed for the memory cell transistors M23E and M24E. Moreover, since the bias transistor VLT3 is non-conductive, the sub-bias line SVL3 is in a floating state so that the sub-bias line SVL3 does not block the current path.

Short circuit paths are created on these two paths depending on the states of the memory cell transistors M23D and M24D. If both the memory cell transistors M23D and M24D are conductive, the sub-bit lines SBL3 and SBL4 exchange a current via the memory cell transistors M23D and M24E. Thus, a correct read operation of the current is blocked. The exchanged current is determined by the difference between the electric potential of the sub-bit line SBL3 and that of the sub-bit line SBL4 at the time the current is read. The sense amplifiers AMP1 and AMP2 are identically structured circuits which supply the same electric potential to the data buses DB1 and DB2, respectively. The multiplexer transistors T1 through T12, which are not components of the memory cell matrix, are low resistance transistors having a large area so that the same electric potential can be held at the main bit lines MBL3 and MBL4. Therefore, the sub-bit lines SBL3 and SBL4, which are components of the memory cell matrix, and the select transistors SBS3 and SBS4 need to have low resistance, which is a problem to be solved.

As explained above, the select transistors SBS3 and SBS4 are low resistance transistors having a large area since they are separated by a pitch wider than the pitch of separation for the memory cell transistors M11E through M36E. Therefore, even if the memory cell transistors M23D and M24D are both conductive and only one of the memory cell transistors M23E and M24E is conductive and the other is nonconductive causing a current to flow, the electric potential differences generated by this current between the main bit line MBL3 and subbit line SBL3 and between the main bit line MBL4 and sub-bit line SBL4, respectively, are kept very small. Hence, the electric potential difference between the sub-bit lines SBL3 and SBL4 can be made small. As a result, a stable current can be detected.

The above-described problem will be explained with a specific example. Here it is assumed that the bias transistors VLT2 and VLT4 are conductive, the bias transistor VLT3 is non-conductive, the memory cell transistors M23D, M24D, and M23E are conductive, the memory cell M24E is non-conductive, the multiplexer transistors T6 and T7 are conductive, and the other multiplexer transistors are non-conductive. In this case, a current flow path (standard path) exists that passes through the bias line VLS, bias transistor VLT2, sub-bias line SVL2, memory cell transistor M23E, sub-bit line SBL3, select transistor SBS3, main bit line MBL3, multiplexer transistor T6, data bus DB1, and sense amplifier AMP1. On the other hand, since the memory cell transistor M24E is non-conductive, no current flow path exists from the bias transistor VLT4 to the sense amplifier AMP2. However, since the memory cells M23D and M24D are conductive, a current flow path (accidental path) also exists that passes through the bias line VLS, bias transistor VLT2, sub-bias line SVL2, memory cell transistors M23E, M23D, and M24D, sub-bit line SBL4, select transistor SBS4, main bit line MBL4, multiplexer transistor T7, data bus DB2, and sense amplifier AMP2. The resistance of this accidental path is higher than that of the standard path since it contains memory cell transistors M23D and M24D. Therefore, the amount of the current that flows through this accidental path is negligible compared with the amount of the current that flows the standard path. Therefore, the current can be detected even in the presence of the accidental path. When the memory cell transistors M23E and M24E are both conductive or non-conductive, the current can be detected without problem even if the memory cells M23D and M24D are both conductive.

Next, the method for selecting a memory cell will be explained. Main bit lines are selected by the multiplexer transistors Ti through T12 which are controlled by selection signals on the bit line selection signal lines BS12E, BS23D, BS34E, BS45D. Hence, the main bit lines are selected so that adjacent ones form a pair. A sub-bit line pair connected to the selected main bit line pair via select transistors turns a selected sub-bit line pair within the selected segment. A row line within the segment is selected by the word lines WL1 through WL3. The corresponding word lines WL1 through WL3 in another segment can use the same signal. The memory cell pair on both exterior sides of the selected sub-bit line pair is simultaneously selected. Therefore, depending on whether the right side of the selected sub-bit line pair is even numbered or odd numbered, the voltage level of one of the bias cut signals ELS and DLS is set to the high level Vcc, and the voltage level of the other is set to 0V. The electric potential of the bias line VLS is introduced to the sub-bias lines on both exterior sides of the selected memory cell pair, and the sub-bias line positioned between the two non-selection memory cell pairs positioned between the selected memory cell pair is put in a floating state. By this control, all the memory cells inside the memory cell matrix can detect a conductive or non-conductive state under the same condition.

The number of sub-bit lines or sub-bias lines within the segment in the first embodiment is the same as the number of transistors that select them. Particularly, it is important that two rows of memory cells be connected to the main bit line. This connection path can be realized without using a complicated transistor configuration. In other words, the shape of the source or drain of the transistor formed by a diffusion region having a high resistance does not need to be altered to a long shape for connection. Moreover, since one main bit line corresponds to two memory cell rows, a select transistor having a wide gate and thus a low impedance can be used.

Thus, according to the first embodiment, the memory matrix of the non-volatile semiconductor memory apparatus having an inter-column arrangement type configuration is divided into several segments such that each segment has multiple rows, and such that the low resistance conductive lines that constitute the rows of each segment alternately consists of sub-bit lines and sub-bias lines. The sub-bit lines are then connected to the corresponding main bit lines, and the sub-bias lines are connected to the bias lines alternately using two types of transistors capable of making the sub-bias lines conductive complementarily. Moreover, by simultaneously selecting mutually adjacent main bit lines, a read operation based on a system that causes a current to flow from a data line into a sense amplifier can be realized in a non-volatile semiconductor memory having a memory matrix with an inter-column arrangement type configuration that can be divided into segments. As a result, a high speed non-volatile semiconductor memory with a high degree of integration can be realized.

Figure 2:
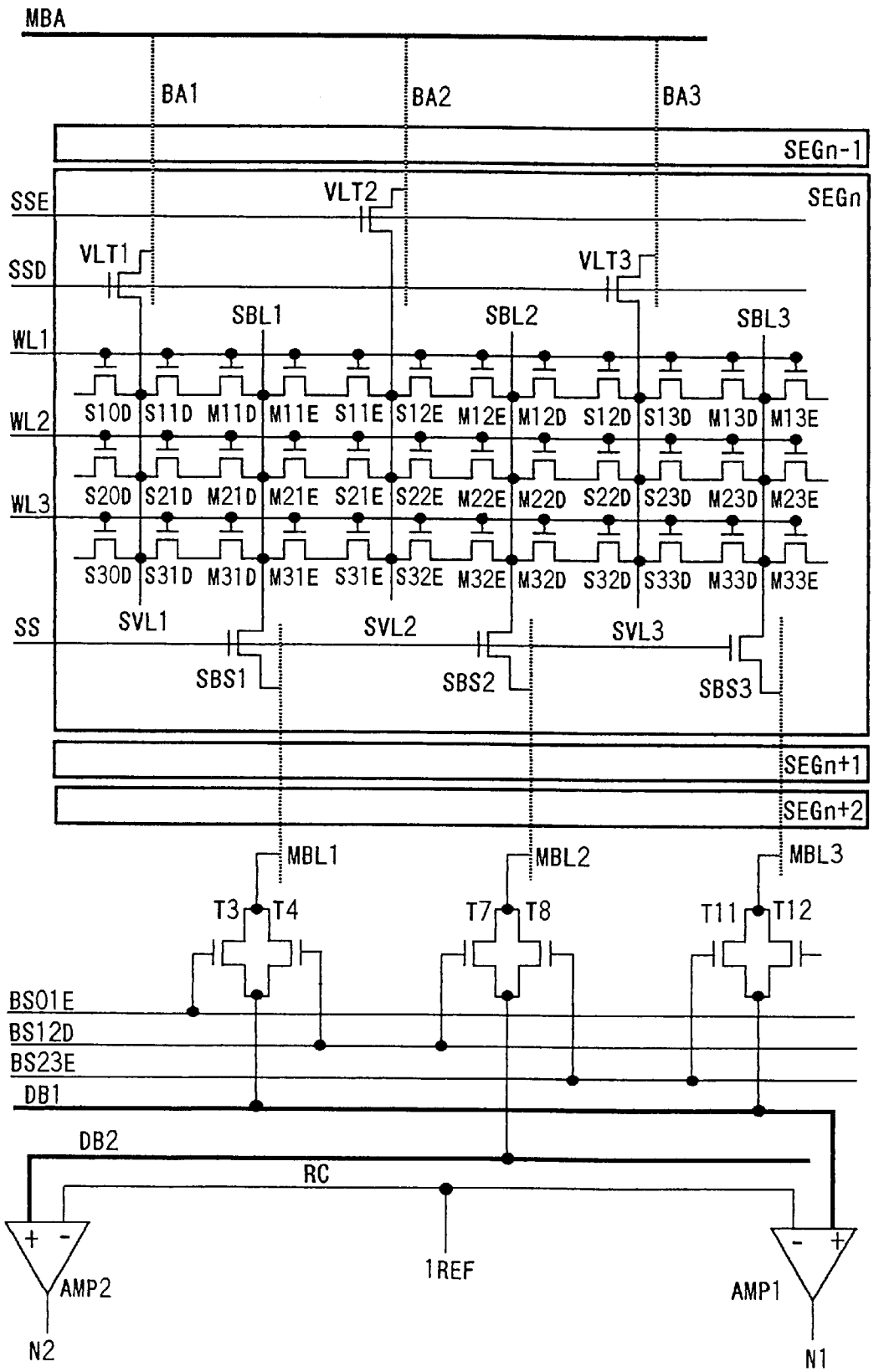
FIG. 2 shows a portion of the circuit according to the second embodiment of the present invention.

FIG. 2 is a circuit diagram showing the second embodiment of the present invention. The second embodiment is obtained by applying the present invention to a non-volatile memory in which memory cells having floating gates such as FLASH memory cells are used.

As shown in FIG. 2, a floating gate transistor such as FLASH memory cell or the like is used as a single memory cell transistor serially connected to a standard (switching) transistor. Even though a pseudo transistor cell structure, called a split gate or the like, can be used, an example in which one memory cell is made of two transistors is used in the second embodiment since a high density transistor arrangement can be achieved and the wafer process can be simplified by the present invention.

In FIG. 2, a standard transistor S11D is serially connected to a floating gate transistor M11D forming a memory cell. The transistor S11D unconditionally turns conductive when it is selected, and completely shuts off the current path when it is not selected. The floating gate transistor M11D turns conductive or non-conductive depending on the written data when selected. However, the floating gate transistor M11D may be conductive or non-conductive when not selected. Though not shown in the drawing, it is possible to connect another column line to the serial connection path between the floating gate transistor M11D and transistor S11D to form a new connection and use the new connection for writing and erasing. In this case, if the total sum of the leak current amounts of a limited number of floating gate transistors within the segment is small, the total sum of the leak current amounts does not prevent the present invention from being applied.

The memory matrix according to the second embodiment is divided into multiple segments as in the first embodiment. Word lines WL1, WL2, and WL3 select only one memory cell within a row in each segment. Column lines SVL1, SVL2, and SVL3, which are formed of metal of the first metal layer, are connected to column bias lines BA1, BA2, and BA3, which are formed of metal of the second metal layer, via bias transistors VLT1, VLT2, and VLT3, respectively. These column bias lines BA1, BA2, and BA3, are donnected to a main bias line MBA. Sub-bit lines SBL1, SBL2, and SBL3, which are formed of the metal of the first metal layer, are connected to main bit lines MBL1, MBL2, and MBL3, which are formed of the metal of the second metal layer, via select transistors SBS1, SBS2, and SBS3, respectively. The main bit lines MBL1, MBL2, and MBL3, which are formed of the metal of the second metal layer, are made of wide aluminum lines or the like since the pitch of separation between the main bit lines MBL1, MBL2, and MBL3 is sufficiently wider than the pitch of separation between the sub-bit lines SBL1, SBL2, and SBL3 or the pitch of separation between the sub-bias lines SVL1, SVL2, and SVL3. Therefore, low resistance transistors having a large area are used for the select transistors SBS1, SBS2, and SBS3, since the pitch of separation between the select transistors SBS1, SBS2, and SBS3 is sufficiently wider than the pitch of separation between the transistors S11D through M33E of the memory cell.

In the above-described memory matrix, the floating gate transistors M11D, M11E, . . . M33E are connected to both sides of the sub-bit lines SBL1, SBL2, and SBL3, respectively, in the direction of extension. The transistors S11D, S11E, . . . are connected serially to each of the floating gate transistors M11D, M11E, . . . M33E, respectively. These transistors S11D, S11E, . . . are connected to both sides of the column lines SVL1, SVL2, and SVL3 in the direction of extension. In other words, the memory cells are arranged and connected to the sub-bit lines SBL1, SBL2, and SBL3 in the form of line symmetry, and the column lines SVL1, SVL2, and SVL3 are formed alternately between the sub-bit lines SBL1, SBL2, and SBL3.

The main bit line MBL1 is connected to the data bus DB1 via the multiplexer transistor air T3 and T4. The main bit line MBL2 is connected to the data bus DB2 via the multiplexer transistor pair T7 and T8. The main bit line MBL3 is connected to the data bus DBD via the multiplexer transistor pair T11 and T12. The multiplexer transistor T3 turns conductive when it receives a signal BS01E, and connects the main bit line MBL1 to the data bus DB1. The multiplexer transistor T4 turns conductive when it receives a signal BS12D, and connects the main bit line MBL1 to the data bus DB1. The multiplexer transistor T7 turns conductive when it receives a signal BS12D, and connects the main bit line MBL2 to the data bus DB2. The multiplexer transistor T8 turns conductive when it receives a signal BS23E, and connects the main bit line MBL2 to the data bus DB2. The multiplexer transistor T11 turns conductive when it receives a signal BS23E, and connects the main bit line MBL3 to the data bus DB1. The sense amplifier AMP1 compares the magnitude of the current flowing on the data bus DB1 with that of the reference current Iref, converts the result of the comparison into an output signal N1, and outputs the output signal N1. The sense amplifier AMP2 compares the magnitude of the current flowing on the data bus DB2 with that of the reference current Iref, converts the result of the comparison into an output signal N2, and outputs the output signal N2.

Next, the information read operation performed on the floating gate transistors M21D and M22D will be explained. A signal on the word line WL2 has a high level Vcc, and signals on the word lines WL1 and WL3 have a low level GND. The signals SS and SSD are set to the Vcc level, and the signal SSE is set to the GND level. The signal SS of the segment SEGn is set to a selected state, and the signals SS of all the other segments SEGn−1, SEGn+1, . . . which are not shown in the drawing, are set to non-selection states. When the signal BS12D turns the Vcc level, the multiplexer transistors T4 and T7 turn conductive. On the other hand, the signals BS01E and BS23E are set to the GND level. As a result, the main bit lines MBL1 and MBL2 are selectively connected to the data buses DB1 and DB2, respectively. The sense amplifiers AMP1 and AMP2 independently apply 0.2V to the data buses DB1 and DB2, respectively, and determine the amount of the inflow current.

By the above-described setting, the floating gate transistor M21D is positioned on a current flow path that passes through the main bias line MBA, column bias line BA1, bias transistor VLT1, column wire SVL1, transistor S21D, floating gate transistor M21D, sub-bit line SBL1, select transistor SBS1, main bit line MBL1, multiplexer transistor T4, data bus DB1, and sense amplifier AMP1. Similarly, the floating gate transistor M22D is positioned on a current flow path that passes through the main bias line MBA, column bias line BA3, bias transistor VLT3, transistor S22D floating gate transistor M22D, sub-bit line SBL2, select transistor SBS2, main bit line MBL2, multiplexer transistor T7, data bus DB2, and sense amplifier AMP2.

On these paths, the portion between the main bias line MBA and the floating gate transistor M21D or M22D is a path between the power source and a memory cell, even if multiple floating lines need to be charged or discharged. However, the speed at which the state of conduction or non-conduction of the floating gate transistor M21D or M22D is detected is not seriously affected by this charge or discharge operation.

Since the bias transistor VTL2 is non-conductive, the column line SVL2 is in a floating state and thus does not block the current path. In this embodiment, the example in which another column line used for writing and erasing is connected to an intermediate point of a serial connection between the transistor and floating gate transistor as described in the first embodiment is omitted. In such a case, the arrangement of the memory cell array turns complicated. However, in this case, the above-described read operation is fundamentally the same.

Moreover, in the second embodiment, the current path splits when both of the floating gate transistors M21E and M22E are conductive, which is a problem, as in the first embodiment. However, as has been explained in the first embodiment, the amount of current that flows into the split current path is negligibly small since the split current path passes through high resistance transistors.

Moreover, in the second embodiment, the memory cells are arranged and connected in the form of line symmetry with respect to the sub-bit lines. However, the advantages of the present invention can be obtained even if the memory cells are not arranged and connected in the form of line symmetry.

In the second embodiment, the area arrangement of the transistors SBS1 through SBS3 and VLT1 through VLT3 provided in the segment has extra space compared with the transistor formation pitch of the memory array in the segment. The area of this extra space is larger than that of the corresponding extra space formed in the first embodiment. Therefore, in the non-volatile semiconductor memory having a memory matrix of inter-column arrangement type configuration divided into several segments, a read operation can be realized based on a system that causes a current to flow into sense amplifiers from data lines. As a result, a high speed non-volatile semiconductor memory having a high degree of integration can be realized.

Thus, according to the present invention, in the non-volatile semiconductor memory having a memory matrix of inter-column arrangement type configuration divided into several segments, a read operation can be realized based on a system that causes a current to flow into sense amplifiers from data lines. As a result, a high speed non-volatile semiconductor memory with a high degree of integration can be realized.

The memory matrices described in the embodiments of the present invention have segments. However, if a memory matrix having only one segment is driven, the selection circuit of the column line can be provided using a pattern having a small area. In this case, no select transistor is needed. According to this configuration, the conductive layer can be formed with a single layer, which is another advantage in addition to the above-described advantages of the present invention.

What is claimed is:

1. A non-volatile semiconductor memory comprising:
   a memory cell array including a plurality of memory rows each having a plurality of memory cell transistors serially connected to each other through a plurality of connection nodes;
   a plurality of word lines each of which commonly connects a plurality of gates of the memory cell transistors of one of the memory rows;
   a plurality of column lines connected to the connection nodes in a direction substantially perpendicular to the memory rows, said column lines including first column lines and second column lines located between the first column lines, the first column lines including third column lines and fourth column lines located between the third column lines;
   a bias potential supply line;
   a plurality of select transistors including first select transistors connected between said bias potential supply line and the third column lines, and second select transistors connected between said bias potential supply line and the fourth column lines, wherein the first select transistors are controlled by a first select signal and the second select transistors are controlled by a second select signal;
   a data bus;
   a multiplexer circuit connected to the second column lines and said data bus, said multiplexer circuit selectively connecting one of the second column lines with said data bus; and
   a sense amplifier connected to said data bus.

2. A non-volatile semiconductor memory as claimed in claim 1, wherein said memory array is divided into a plurality of segments.

3. A non-volatile semiconductor memory as claimed in claim 2, wherein the second column lines are connected to said multiplexer circuit via a plurality of third select transistors controlled by a segment select signal.

4. A non-volatile semiconductor memory as claimed in claim 3, wherein the third select transistors are low resistance transistors having an area larger than an area of the memory cell transistors.

5. A non-volatile semiconductor memory as claimed in claim 3, wherein said multiplexer circuit and the third select transistors are connected by a plurality of bit lines each having a low resistance and formed of metal line having a width wider than a width of the second column lines.

6. A non-volatile semiconductor memory as claimed in claim 1, wherein said data bus includes a pair of data buses and the sense amplifier includes a first sense amplifier connected to one of the data buses and a second sense amplifier connected to another one of the data buses, and wherein said multiplexer circuit selectively connects two of the second column lines with the pair of data buses, respectively.

7. A method of reading data from a non-volatile semiconductor memory including memory rows each having memory cells serially connected to each other, word lines commonly connected to gates of memory cell transistors within a same memory row, column lines connected to the memory cell transistors in a direction that is substantially perpendicular to the memory rows, the column lines including first column lines and second column lines located between the first column lines, and a pair of data buses selectively connected to the second column lines, the method comprising:

supplying a bias potential to two of the first column lines which are not adjacent each other;

selecting one of the word lines;

selectively connecting the second column lines located next to the first column lines supplied with the bias potential, with the pair of data buses; and detecting current flowing on the pair of data buses so as to determine data stored in the memory cell transistors which are connected to the selected word line and are located between the first column lines supplied with the bias potential and the second column lines connected to the pair of data buses.

8. A method of reading data from a non-volatile semiconductor memory according to claim 7, wherein said selectively connecting includes turning on select transistors connected between the second column lines and the data buses, and wherein each of the select transistors have a larger area than an area of each of the memory cell transistors so that a resistance of each of the select transistors is lower than a resistance of each of the memory cell transistors.

9. A non-volatile semiconductor memory comprising:

a plurality of memory cell arrays each of which having a plurality of memory rows, each of the memory rows including a plurality of memory cell transistors serially connected to each other through a plurality of connection nodes;

a plurality of word lines each of which commonly connecting a plurality of gates of the memory cell transistors of one of the memory rows;

a plurality of column lines connected to the connection nodes in a direction substantially perpendicular to the memory rows, said column lines including first column lines and second column lines located between the first column lines;

a plurality of first select transistors;

a bias potential supply line connected to the first column lines through said first select transistors;

a data bus;

a plurality of second select transistors controlled by a memory array select signal, each of said second select transistors having a resistance lower than a resistance of each of the memory cell transistors;

a multiplexer circuit connected to the second column lines via said second select transistors and to said data bus, said multiplexer circuit selectively connecting one of the second column lines with said data bus; and a sense amplifier connected to said data bus.

10. A non-volatile semiconductor memory as claimed in claim 9, wherein the first column lines include third column lines and fourth column lines located between the third column lines, and wherein said first select transistors include third select transistors connected between said bias potential supply line and the third column lines and fourth select transistors connected between said bias potential supply line and the fourth column lines.

11. A non-volatile semiconductor memory as claimed in claim 10, wherein the third select transistors are controlled by a first select signal and the fourth select transistors are controlled by a second select signal.

12. A non-volatile semiconductor memory as claimed in claim 9, wherein each of said second select transistors have an area larger than an area of each of the memory cell transistors.

13. A non-volatile semiconductor memory as claimed in claim 9, wherein said multiplexer circuit and said second select transistors are connected by a plurality of bit lines each having a low resistance.

14. A non-volatile semiconductor memory as claimed in claim 13, wherein the bit lines are formed of metal, and wherein each of the bit lines have a width wider than a width of each of the column lines.

15. A non-volatile semiconductor memory as claimed in claim 9, wherein said data bus includes a pair of data buses and the sense amplifier includes a first sense amplifier connected to one of the data buses and a second sense amplifier connected to another one of the data buses, and wherein said multiplexer circuit selectively connects two of the second column lines with the pair of data buses, respectively.

16. A non-volatile semiconductor memory comprising:

a plurality of memory cell arrays each having a plurality of memory rows, each of the memory rows including a plurality of memory cell transistors serially connected to each other through a plurality of connection nodes;

a plurality of word lines each of which commonly connects a plurality of gates of the memory cell transistors of one of the memory rows;

a plurality of metal column lines connected to the connection nodes in a direction substantially perpendicular to the memory rows, said metal column lines including first column lines and second column lines located between the first column lines;

a plurality of first select transistors;

a bias potential supply line connected to the first column lines through said first select transistors;

a plurality of second select transistors;

a plurality of metal bit lines connected to said second column lines through said second select transistors, each of the metal bit lines having a resistance lower than a resistance of each of said metal column lines;

a data bus;

a multiplexer circuit connected to the metal bit lines and said data bus, said multiplexer circuit selectively connecting one of the second column lines with said data bus; and a sense amplifier connected to said data bus.

17. A non-volatile semiconductor memory as claimed in claim 16, wherein the first column lines include third column lines and fourth column lines located between the third column lines, and wherein said first select transistors include third select transistors connected between said bias potential supply line and the third column lines and fourth select transistors connected between said bias potential supply line and the fourth column lines.

18. A non-volatile semiconductor memory as claimed in claim 17, wherein the third select transistors are controlled by a first select signal and the fourth select transistors are controlled by a second select signal.

19. A non-volatile semiconductor memory as claimed in claim 16, wherein each of said second select transistors have a resistance lower than a resistance of each of the memory cell transistors.

20. A non-volatile semiconductor memory as claimed in claim 16, wherein each of said second select transistors have an area larger than that of an area of each of the memory cell transistors.

21. A non-volatile semiconductor memory as claimed in claim 16, wherein each of said metal bit lines have a width wider than a width of each of said metal column lines.

22. A non-volatile semiconductor memory as claimed in claim 16, wherein said data bus includes a pair of data buses and the sense amplifier includes a first sense amplifier connected to one of the data buses and a second sense amplifier connected to another one of the data buses, and wherein said multiplexer circuit selectively connects two of the second column lines with the pair of data buses, respectively.

* * * * *